United States Patent
Ji et al.

[11] Patent Number: 6,118,726
[45] Date of Patent: *Sep. 12, 2000

[54] SHARED ROW DECODER

[75] Inventors: L. Brian Ji, Wappingers Falls; Toshiaki Kirihata, Poughkeepsie, both of N.Y.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 09/017,012

[22] Filed: Feb. 2, 1998

[51] Int. Cl.$^7$ .................................................. G11C 8/00

[52] U.S. Cl. .............................. 365/230.06; 365/230.03

[58] Field of Search ...................... 365/230.06, 230.03, 365/230.08

[56] References Cited

U.S. PATENT DOCUMENTS

| | | | |
|---|---|---|---|
| 4,384,347 | 5/1983 | Nakano | 365/189 |
| 4,393,472 | 7/1983 | Shimada et al. | 365/190 |
| 4,758,993 | 7/1988 | Takemae | 365/222 |
| 5,091,851 | 2/1992 | Shelton et al. | 395/425 |
| 5,267,215 | 11/1993 | Tsujimoto | 365/230.03 |
| 5,289,417 | 2/1994 | Ooishi et al. | 365/200 |
| 5,315,548 | 5/1994 | Ooishi et al. | 365/189.01 |
| 5,327,389 | 7/1994 | Seok et al. | 365/230.03 |
| 5,386,385 | 1/1995 | Stephens, Jr. | 365/189.05 |
| 5,446,700 | 8/1995 | Iwase | 365/230.06 |
| 5,502,675 | 3/1996 | Kohno et al. | 365/200 |
| 5,519,650 | 5/1996 | Ichimura et al. | 365/63 |
| 5,610,871 | 3/1997 | Hidaka | 365/230.03 |

OTHER PUBLICATIONS

Y. Kodama et al., "A 150–MHz 4–Bank 64M–bit SDRAM with Address Incrementing Pipeline Scheme", 1994 IEEE, Symposium on VLSI Circuits Digest of Technical Papers, pp. 81–82.

G. Bronner et al. "A Fully Planarized 0.25um CMOS Technology for 256Mbit DRAM and Beyond", 1995 Symposium on VLSI Technology Digest of Technical Papers, pp. 15–16.

T. Saeki et al. "A 2.5ns Clock Access 250MHz 256Mb SDRAM with a Synchronous Mirror Delay", 1996 IEEE International Solid–State Circuits Conference.

T. Kirihata et al., "Fault–Tolerant Designs for 256 Mb DRAM", IEEE Journal of Solid–State Circuits, vol. 31, No. 4, Apr. 1996, pp. 558–566.

Y. Watanabe et al., "A 286 mm2 256 Mb DRAM with x 32 Both–Ends DQ", IEEE Journal of Solid–State Circuits, vol. 31, No. 4, Apr. 1996, pp. 567–574.

J. Yoo et al., "A 32–Bank 1 Gb Self–Strobing Synchronous DRAM with 1 GByte/s Bandwidth", IEEE Journal of Solid–State Circuits, vol. 31, No. 11, Nov. 1996, pp. 1635–1644.

*Primary Examiner*—Do Hyun Yoo
*Attorney, Agent, or Firm*—Daryl K. Neff, Esq.

[57] ABSTRACT

A shared row decoder and shared row decoding method are disclosed herein which provides separate timed selection signals to each of a first memory unit and a second memory unit. The shared row decoder includes an address input circuit responsive to the states of a plurality of address signals and which provides an enabling or disabling input. In addition, first and second selection circuits are provided which are responsive to enabled conditions of first and second block selection inputs, first and second timing signals, respectively and enabling input of the address input circuit to provide separate timed selection signals to the first and second memory units, respectively.

8 Claims, 12 Drawing Sheets

SHARED ROW DECODER

RELATED APPLICATION DATA

This invention is related to 1) commonly assigned U.S. patent application Sel. No. 09/017,011 entitled: "Intra-Unit Column Address Increment System for Memory"; 2) commonly assigned U.S. patent application Ser. No. 09/017,015 entitled: "Single Ended Read Write Drive For Memory"; and 3) commonly assigned U.S. patent application Ser. No. 09/017,017 entitled: "Intra-Unit Block Addressing System for Memory"; the three of which are filed on even date herewith.

FIELD OF THE INVENTION

This invention relates to the design of a random access memory (RAM) and more specifically to circuitry which accesses and transfers data with a set of address inputs to and from a storage array within a RAM.

BACKGROUND OF THE INVENTION

Maximization of storage capacity and minimization of power usage and access time are goals in the design of integrated circuits (ICs, "chips"), especially as to ICs containing memory and logic arrays for use in data processing systems.

I. Row Decoder Design

To increase the storage capacity of a random access memory (RAM), it is important to find ways to reduce the amount of area occupied by circuitry other than the storage cell arrays of the RAM. One way in which this can be accomplished is by utilizing a shared row decoder design which permits wordlines in both left and right units of a bank division of the RAM to be accessed through the same set of row decoders, thus decreasing by half the number of row decoders required to perform that function. However, this goal is not well served if the reduction in decoder circuitry is made at the expense of increased access time or higher power consumption for the RAM, especially in cases where the design for a RAM chip requires a plurality of banks.

FIG. 1 shows an example of a 32 Mb double unit 10 which includes left and right units 12, 20, left and right wordline (WL) driver units 14, 18, and a shared row decoder unit 16 which receives inputs including row predecoded addresses XP1 . . . XPn, and block select inputs BLKSELs. This 32 Mb double unit organization has been incorporated into an existing design for a 256 Mb DRAM, the details of which are described in the Article by Y. Watanabe et al. entitled "A 286 mm2 256 Mb DRAM with ×32 Both-Ends DQ," *IEEE Journal of Solid-State Circuits*, Vol. 31, No. 4, April, 1996 ("the Watanabe Article"). Within the shared row decoder unit 16 there are provided a plurality of row decoders 30, the structure of which is shown in FIG. 2.

As shown in FIG. 2, each row decoder 30 of shared row decoder unit 16 (FIG. 1) receives as inputs a plurality of row predecoded addresses, for example three predecoded addresses (XP1, XP2, XP3), and a block select signal BLKSEL. Upon receiving the correct combination of row predecoded addresses XPs to enable the row decoder 30 at a time when the BLKSEL signal is active, the row decoder 30 activates a row decoder output signal RDOUT which is provided to both a left WL driver 14 and a right WL driver 18 of the double unit 10. In this way, only one row decoder 30 is needed to enable the selection of blocks from both left and right units, 12, 20.

In operation, the BLKSEL signal is held active during a time in which both units 12, 20 are in an active state. During a reset phase, when the BLKSEL signal enters an inactive state again, RDOUT signals of row decoders 30 are precharged to HIGH, at which time units 12, 20 are simultaneously deactivated.

It will be understood that the row predecoded addresses XPs must hold the information constant for the duration in which BLKSEL is active. Otherwise, RDOUT might be falsely enabled by the XPs transition between states because the XPS provide the enabling and trigger conditions for RDOUT.

Because the row decoder 30 requires the XPs to hold the information constant during BLKSEL active cycles, it is not possible to use row decoder unit 30 in a double unit 10 in which it is desired to utilize each unit 12, 20 as a separate bank under separate row addressing control. That is, row decoder 30 cannot be used in a double unit 10 which is configured to operate as two or more banks.

FIG. 3 shows a schematic for the design of another existing row decoder unit 40 which permits a pair of left and right units 12, 20 to be configured as a pair of banks, rather than just a single bank, as is the conventional configuration. Row decoder unit 40 includes sets of row decoder circuits 42 for each of the left unit 12 and the right unit 20 which are completely independent from each other, i.e. the decoder circuits 42 in each set include independent devices which receive and act upon the row predecoded addresses and block select signals to activate wordlines within the respective left and right units, 12, 20. Consequently, left and right units 12, 20 can each be independently controlled, to access storage locations at different row addresses at the same time.

However, row decoder unit 40, which duplicates the input and output circuits for all predecoded address and block select inputs, requires twice the number of row predecoded address signal lines and row decoder circuits 42 as row decoder unit 16. In consequence, the area occupied by row decoder unit 40 on an IC is substantially greater than the area occupied by row decoder unit 16. It would be advantageous to provide a row decoder unit which permits a double unit to be configured with multiple banks, without requiring row decoder circuits therein to be duplicated.

Accordingly, it is an object of the invention to provide a row decoder circuit of a row decoder unit which permits a plurality of banks to be configured within a pair of memory units, i.e. a pair of physically contiguous memory arrays served by the row decoder unit, while reducing the amount of area occupied by the row decoder unit.

It is another object of the invention to provide a row decoder unit which reduces the consumption of current while permitting a double unit to be configured as multiple banks.

II. Block Address Assignment Within Banks

In an existing RAM (as shown, for example, in FIG. 1), blocks are arranged in the same way within left and right units 12, 20, namely, numbered in sequential order from bottom to top (or from top to bottom). As such, blocks which are accessed by the same address inputs are located across from each other at the same distance away from the ends 22 of the units 12, 20. That is, block 0 in the left unit 12 is located across from block 0 in the right unit 20 and lies at the end 22 of the left unit 12, as does block 0 in the right unit 20. In the same way, block 1 in the left unit is located across from block 1 in the right unit 20 and lies one block away from the end 22 of the left unit 12, as does block 1 in the right unit 20.

However, the inventors have found that addressing blocks within the left and right units 12, 20 in such symmetrical fashion is undesirable. Within a unit 12, one or more wordlines in a block are activated at a time by signals supplied to the row decoder from one end 22 of the unit 12. As described above with reference to FIG. 3, units 12, 20 can be accessed independently in an ACTIVE mode when double unit 10 is configured as multiple banks, each bank having independent row decoder circuits 42. However, when double unit 10 is configured as a single bank, units 12, 20 are not independently controlled, such that the row decoder unit 16 accesses the same physical block numbers across both units 12, 20. Even when the double unit 10 is configured as multiple banks, when the double unit 10 is operated in known Column-Address-Strobe (CAS) Before Row-Address-Strobe (RAS) Refresh mode (CBR mode), locations will be accessed within each unit 12, 20 with signals selecting the same block numbers in both units 12, 20. Thus, in CBR mode, whether in a single bank unit or in a double unit having a multiple bank configuration, wordlines in the same numbered blocks in both left and right units 12, 20 are alternately or simultaneously accessed, first from one unit, for example, the left unit 12, then from the other unit, i.e. the right unit 20 in this example.

When high numbered blocks are accessed, e.g block 15 in the left and right units 12, 20, the greater length of signal travel (and consequent voltage drop) from the end 22 of the units 12, 20 to such blocks requires more current to be supplied than that required to access low-numbered blocks located closer to the end 22 of the left and right units 12, 20, i.e. block 0 in each unit. Thus, in the existing arrangement of blocks, the current consumption within a double unit 10 varies with the address of the block selected for access. Likewise, the average voltage drop on row selection signal lines to both units 12, 20 (e.g. row predecoded addresses and block select signals) varies with the address of the block selected for access. In addition, heating effects due to the consumption of current vary with both time and with the location of a block within a bank.

Accordingly, an object of the invention is to provide an arrangement of blocks within a double unit which reduces or eliminates the dependence of the current consumption, heating effects and average voltage drop upon the address of the block which is accessed.

III. Column Address Increment Design

The need to increase density while decreasing the power consumption of RAMs for applications such as laptop computers imposes limitations upon the speed at which cells within a RAM can be accessed. However, these on-chip considerations must not be allowed to unduly limit the speed of off-RAM access, since otherwise, the off-RAM access speed could become a bottleneck in the performance of the computing system which utilizes the RAM.

One known way of increasing the off-RAM access speed in synchronous dynamic RAMs (DRAMs) is to perform a modified column burst mode operation in which sequentially adjacent addresses are accessed simultaneously from an "odd" column division (left unit) and an "even" column division (right unit) of a bank, rather than merely providing addresses to the left unit and to the right unit in sequence, as described above with reference to FIG. 1. To perform such operation, the lowest order bits of the column address are transferred to one of the odd/even units after being incremented by one, and transferred directly without being incremented to the other one of the odd/even units. Such operation is referred to a "column address increment". An example of a circuit design which performs such operations is described in an article by Yukinori Kodama et al. entitled "A 150 MHz 4-Bank 64 Mbit SDRAM with Address Incrementing Pipeline Scheme," 1994 *Symposium on VLSI Circuits Digest of Technical Papers*, pp. 81–82 ("the Kodama Article").

The Kodama Article describes a design for a DRAM which performs column address increment to transfer data to and from a storage locations within a bank at twice the access speed of the storage cells within. In that design, each bank is configured as a double memory unit (e.g. as in FIG. 1; 10) having left and right units 12, 20 separated from each other by row decoder circuitry for the bank. Left and right units 12, 20 form odd and even units of the bank which are accessed with consecutive column addresses that are provided simultaneously to both odd and even units. The row decoder circuitry between left and right units 12, 20 decodes a set of row selection signals and activates, at the same time, wordlines in both left and right units 12, 20 in accordance with to the decoding result. A similar concept is discussed in U.S. Pat. No. 5,386,385 to Stephens, Jr.

The Kodama Article, and the Stephens, Jr. Patent describe systems which implement column address increment pipelining, but only in a double unit 10 which is configured as a single bank, i.e. with a left unit 12 implementing an "odd" unit, and a right unit 20 implementing an "even" unit. The Kodama Article and the Stephens, Jr. Patent do not describe a way in which column address increment could be implemented in a double unit 10 which is configured as multiple banks. A way of providing column address increment pipelining in a double unit 10 having any number of banks therein would be desirable.

Accordingly, it is an object of the invention to provide a structure and method of providing column address increment pipelining in a double unit 10 in which more than one odd unit and one even unit are configured within the same unit (e.g. unit 12, or unit 20) and in which wordlines are supported by the same set of row decoders and wordline driver circuitry.

Another object of the invention is to provide a structure and method of providing column address increment operation simultaneously in each bank of a plurality of banks configured within a double unit 10.

IV. Read Write Drive Design

Towards the goal of increasing the speed of memory access while holding the line on or reducing the power consumption, it is important to transmit large current bearing signals within the RAM as efficiently as possible. Therefore, designs which reduce: 1) the amount of current needed to drive large current signals; 2) the number of signals being driven; or 3) the frequency at which large current signals switch between low and high levels, are desirable to reduce the power consumption while increasing the access speed of the RAM.

In an existing RAM described in the Watanabe Article referred to above, and as shown in detail in FIG. 4, data is transferred to and from a DRAM storage array 400 by a circuit arrangement and signal flow known as "master DQ" (MDQ) architecture. The detailed schematic of storage array 400 in FIG. 4 corresponds to the internal organization of unit 12 or 20 of FIG. 1. Within the storage array 400, as provided by the MDQ architecture, data is passed from bitline pairs within the storage array 400 by a hierarchical arrangement of local DQ lines (LDQs) and master DQ lines (MDQs). A data input output circuit (DIO) 490 is coupled to the storage array 400 by a second sense amplifier unit (SSA) 450. SSA 450 receives data signals on master bitline pairs (MDQs) of the storage array 400, regenerates the data and transmits it again onto bidirectional read write drive lines (RWD, RWD') 480 to the DIO 490.

When accessing the storage array 400 during column burst mode operation in which several adjacent column storage locations are accessed sequentially, the amount of current required to perform such operation is known as the column burst current. The largest single contributor to the column burst current is the current needed to drive the RWD and RWD' lines 480 in transmitting data between the second sense amplifier (SSA) 450 and the data input/output circuit (DIO) 490.

With reference to FIG. 4b, signal levels on either line RWD, or line RWD' 480 are driven, in every clock cycle of the DIO 490, between an (inactive) precharge voltage level and an (active) data level. Regardless of the data pattern, large current is required to drive the rapid swing between the precharge voltage level and the active data level in the presence of large capacitive loads 460, 461.

It would be desirable to have a circuit and method of signal transmission which reduces the amount of current needed to drive signals between the second sense amplifier 450 and the data input/output circuit 490. Reducing the number of signal lines RWD, RWD' for each data bit from two to one, and eliminating the precharge cycle on the RWD signal line would greatly reduce the amount of current required to drive a high capacitive load 460 coupled to the signal line.

Accordingly, it is an object of the invention to provide a second sense amplifier circuit and signal arrangement by which data is transmitted from a second sense amplifier to a data input/output circuit with less current than with existing second sense amplifier designs.

It is another object of the invention to provide a second sense amplifier circuit which outputs data onto a single read write drive signal, in place of two read write drive signals.

It is a further object of the invention to provide a circuit and method of signal transmission which reduces the rate at which voltage levels of the read write drive signal are switched.

Still another object of the invention is to provide a circuit and method of signal transmission by which data bits are transmitted sequentially on a read write drive signal without requiring the signal line to be precharged between each data bit.

SUMMARY OF THE INVENTION

The shared row decoder and shared row decoding method of the present invention provide separate timed selection signals to each of a first memory unit and a second memory unit. The shared row decoder includes an address input circuit responsive to the states of a plurality of address signals and which provides an enabling or disabling input. In addition, first and second selection circuits are provided which are responsive to enabled conditions of first and second block selection inputs, first and second timing signals, respectively and enabling input of the address input circuit to provide separate timed selection signals to the first and second memory units, respectively.

In the method of the present invention, a single decoding result is obtained from a plurality of address signals presented to a decoder. The decoding result is then further combined with first and second block selection signals and first and second timing signals to provide separate timed selection signals to each of first and second memory units.

DETAILED DESCRIPTION OF THE PREFERRED EMBODIMENTS

I. SHARED ROW DECODER

Figure 3:
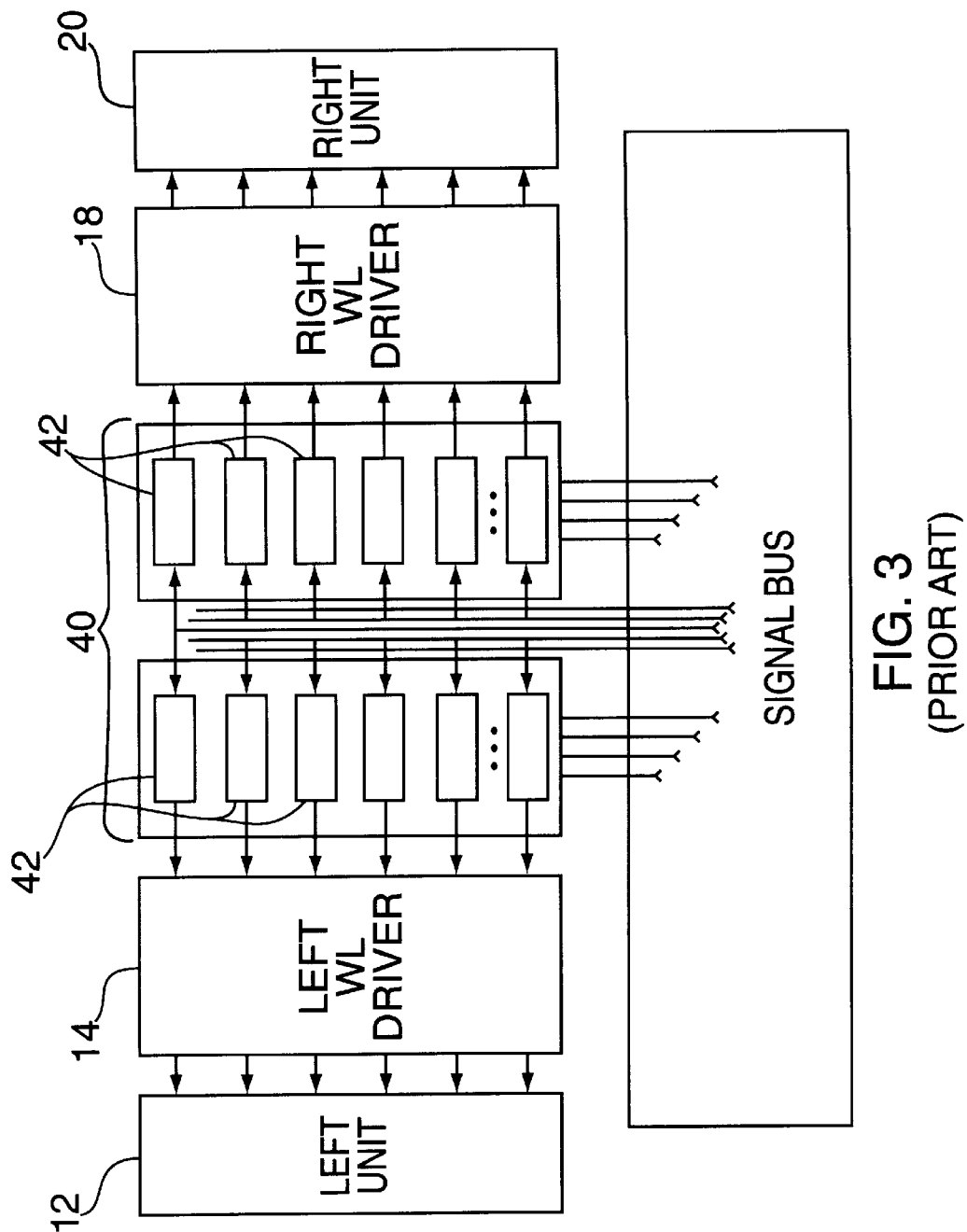
FIG. 3 is a block and schematic diagram showing a prior art row decoder unit 40 for independent accessing of left and right units of a double memory unit.
Figure 5:
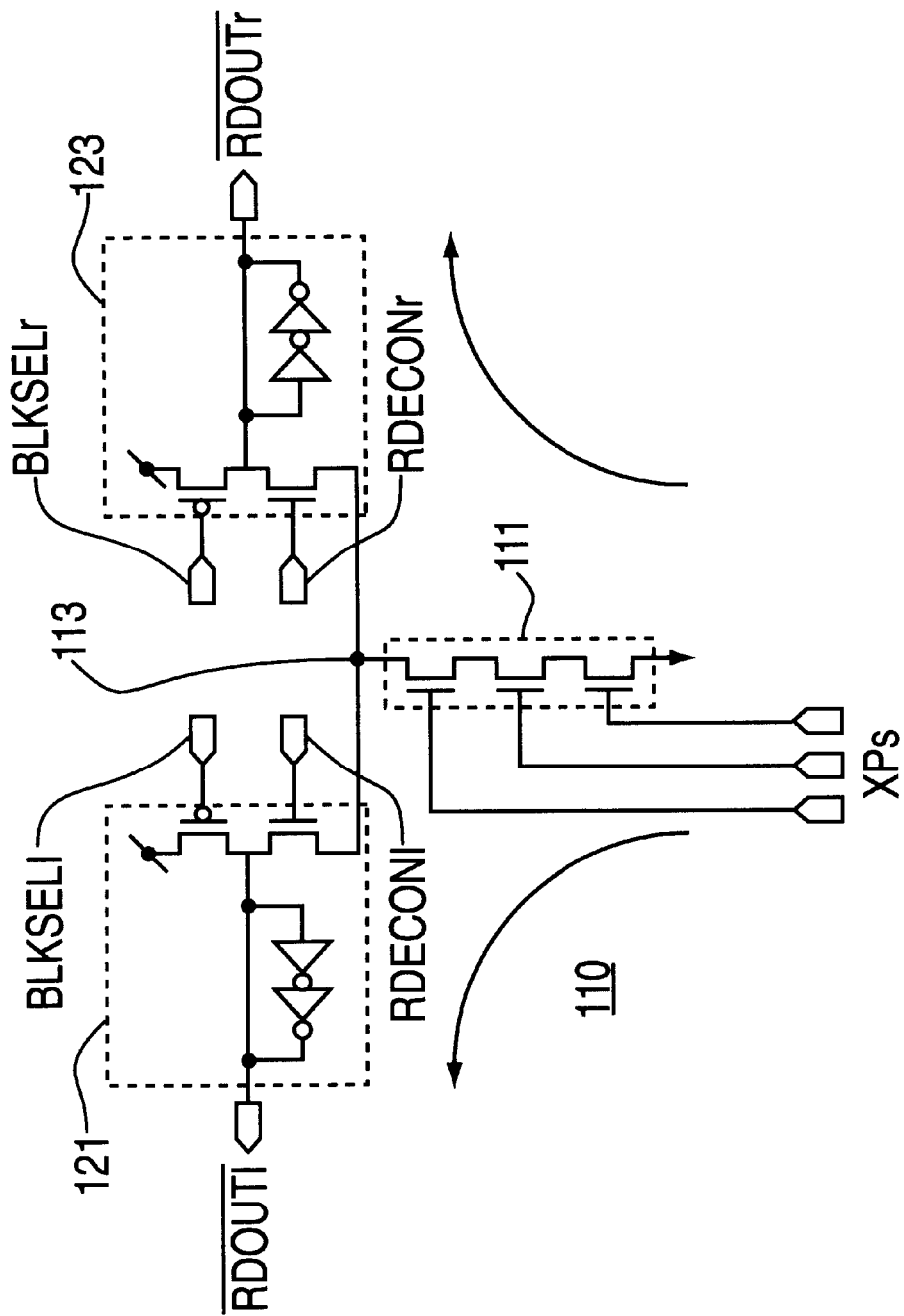
FIG. 5 is a block and schematic diagram showing the structure and operation of the shared row decoder 110 of the present invention.

FIG. 5 is a schematic circuit diagram of a shared row decoder 110 of the present invention. Row address input circuit 111 receives row predecoded address input signals, for example XP1, XP2, XP3, and provides an enabled/disabled input at terminal 113 which is determined by the states of the row predecoded address inputs. Separate left block select (BLKSELl) and right block select (BLKSELr) signals are provided to left and right decoder latch circuits 121 and 123, respectively. The block select signals BLKSELl and BLKSELr are held active during an active cycle of a bank in which the left and the right blocks are located. In addition, a left Row-DECoder-ON (RDECONl) signal, and a pulsed right Row-DECoder-ON (RDECONr) signal are provided to left and right decoder latch circuits 121, 123, respectively. These pulsed RDECONl and RDECONr signals allow for the activation of units 12, 20 within double unit 10 at different selected times, without requiring separate row decoder circuits 42, as described above with reference to FIG. 3.

Figure 6:
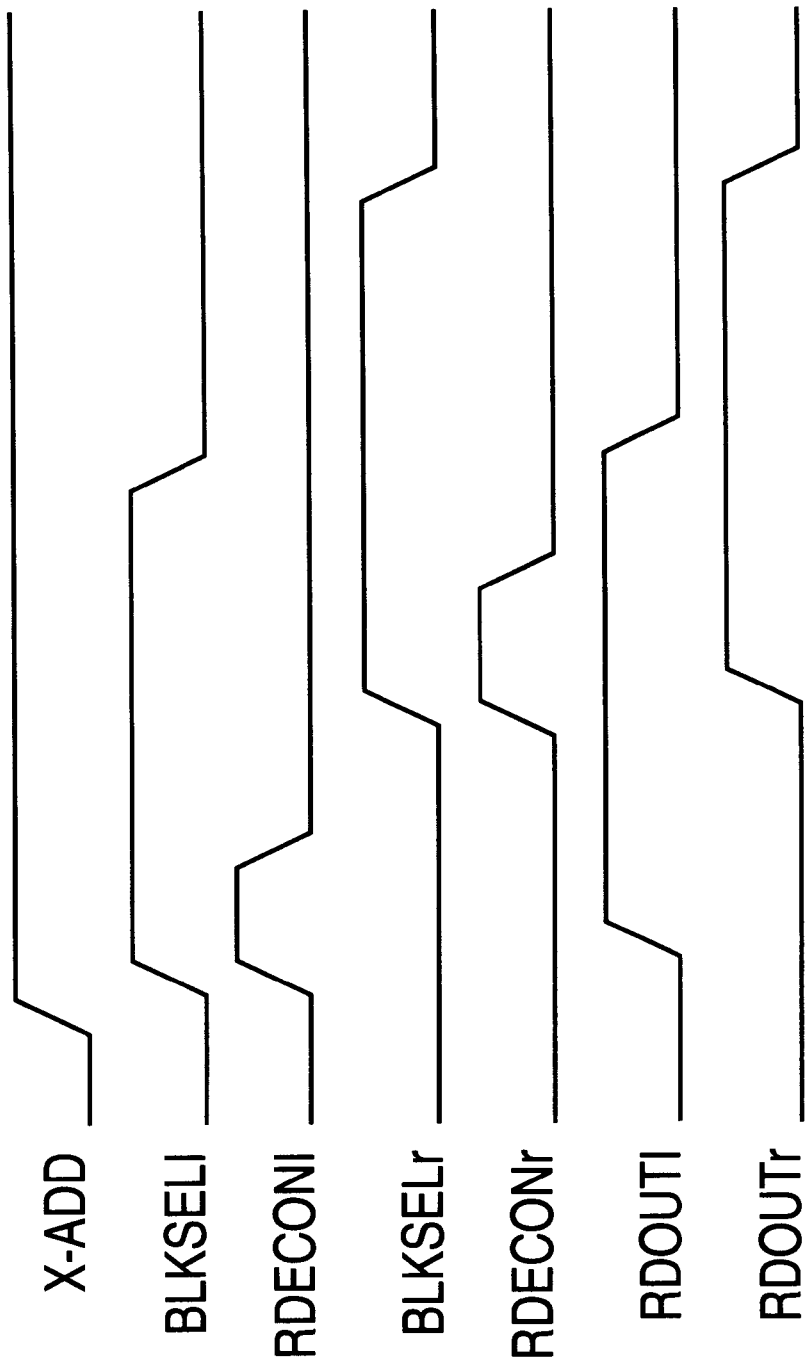
FIG. 6 is a timing diagram for the shared row decoder 110 of FIG. 5.

By operation of the shared row decoder 110 of the invention, an enabling input 113 is latched into one of the left or the right latch circuits 121, 123 when the values of the predecoded address inputs XP1, 2, and 3 are in the right combination for the particular decoder, and the RDECONl signal or the RDECONr signal becomes active, respectively. (See timing diagram, FIG. 6). Importantly, RDECONl and RDECONr are pulsed at different times so that the values of the predecoded address inputs at XP1, 2 and 3 will be allowed to change from the time the left unit 12 is accessed until the right unit 20 is accessed.

Note that with the pulsed timed control over the latch circuits 121 and 123, the predecoded address inputs are not required to swing once during every RAS cycle. Rather, predecoded address inputs XP1, XP2, XP3, etc. are permitted to maintain the same states from one cycle to the next, and change state only when the information content of the address signals changes. This results in a reduction of the current required to operate shared row decoder 110, in relation to the row decoder 30 described above with reference to FIG. 2. In addition, the pulsed timed control over the latch circuits 121, 123 permits the implementation of a shared row decoder 110 in which the address input circuit 111 and signal lines which carry row predecoded address signals XP1, XP2, XP3, etc. thereto are shared between left and right units 12, 20 (FIG. 1), resulting in a net savings of area occupied by the row decoder circuitry for a double unit 10 of an IC.

II. ASYMMETRIC ASSIGNMENT OF BLOCK ADDRESSES

A second aspect of the invention is the asymmetric assignment of block addresses within left and right units of a unit or bank. This aspect of the invention can be utilized either together with or separately from the shared row decoder aspect or other aspects of the invention.

Figure 1:
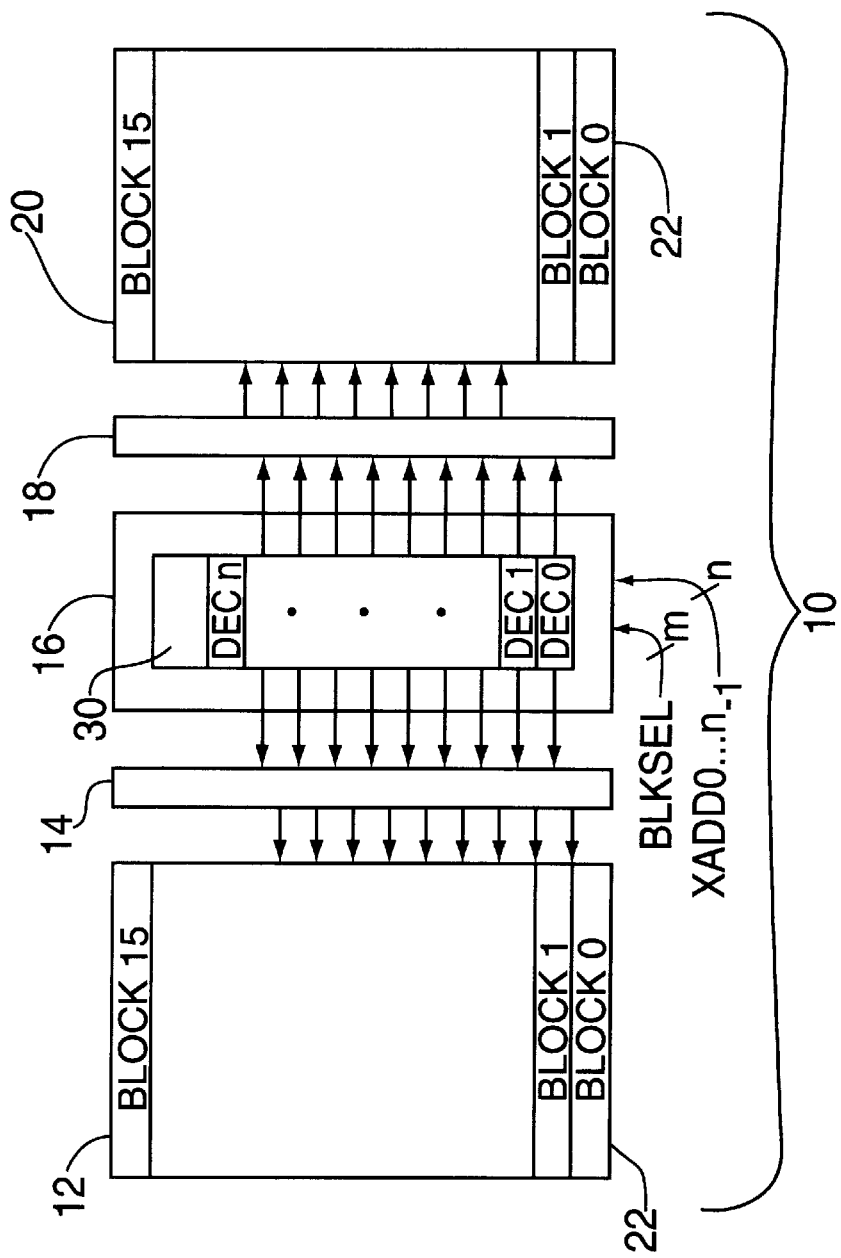
FIG. 1 is a block and schematic diagram showing the structure of a conventional double memory unit of a random access memory (RAM).
Figure 2:
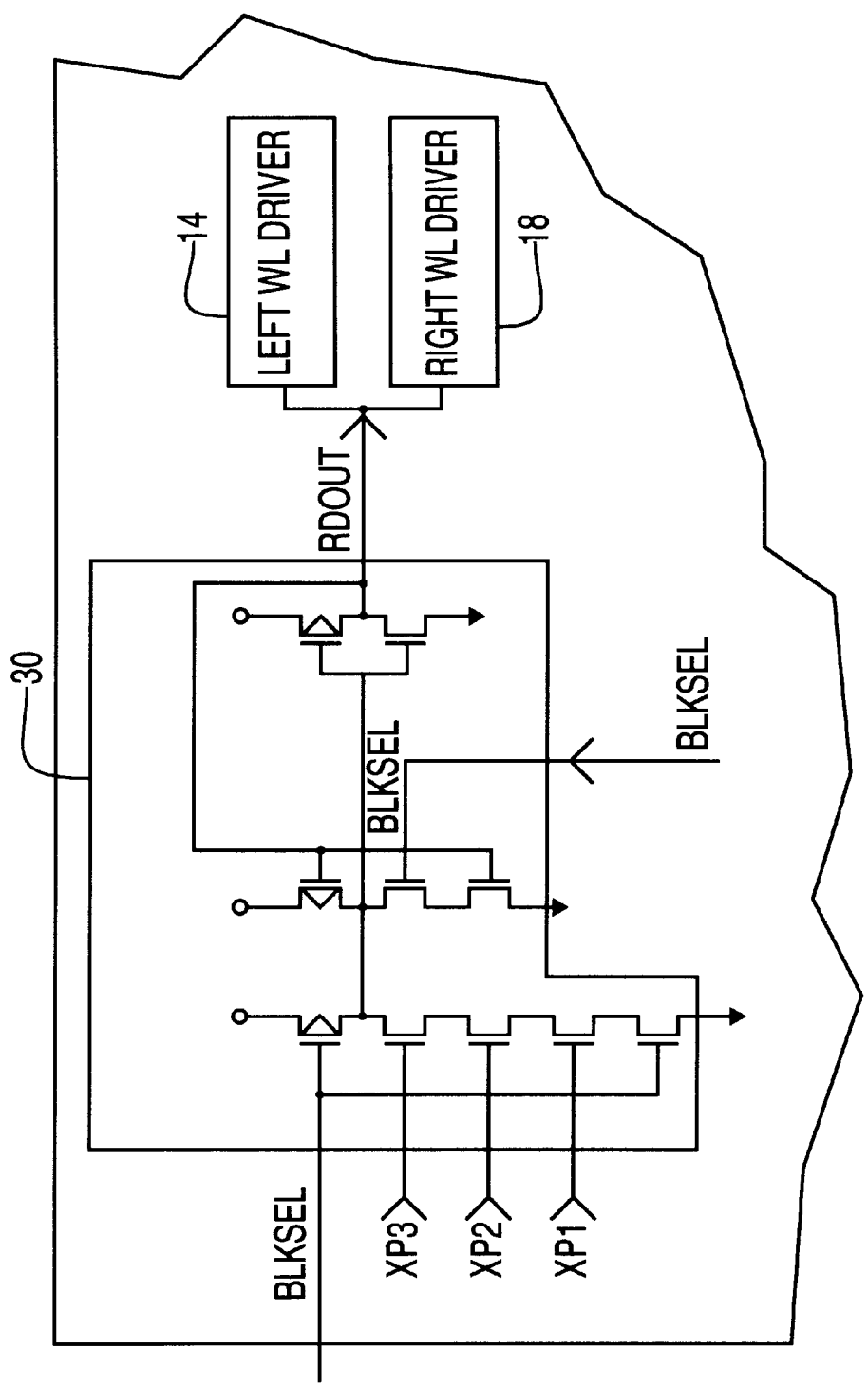
FIG. 2 is a block and schematic diagram showing a prior art row decoder 30 unit for a double memory unit.

With reference to FIG. 1, in banks of existing RAMs, blocks having the same number, i.e. the same block address, are located at the same position within the left and right units of a unit or bank. For example, block 0 in the left unit is located on the bottom left, and block 0 in the right unit is located on the bottom right.

Figure 7:
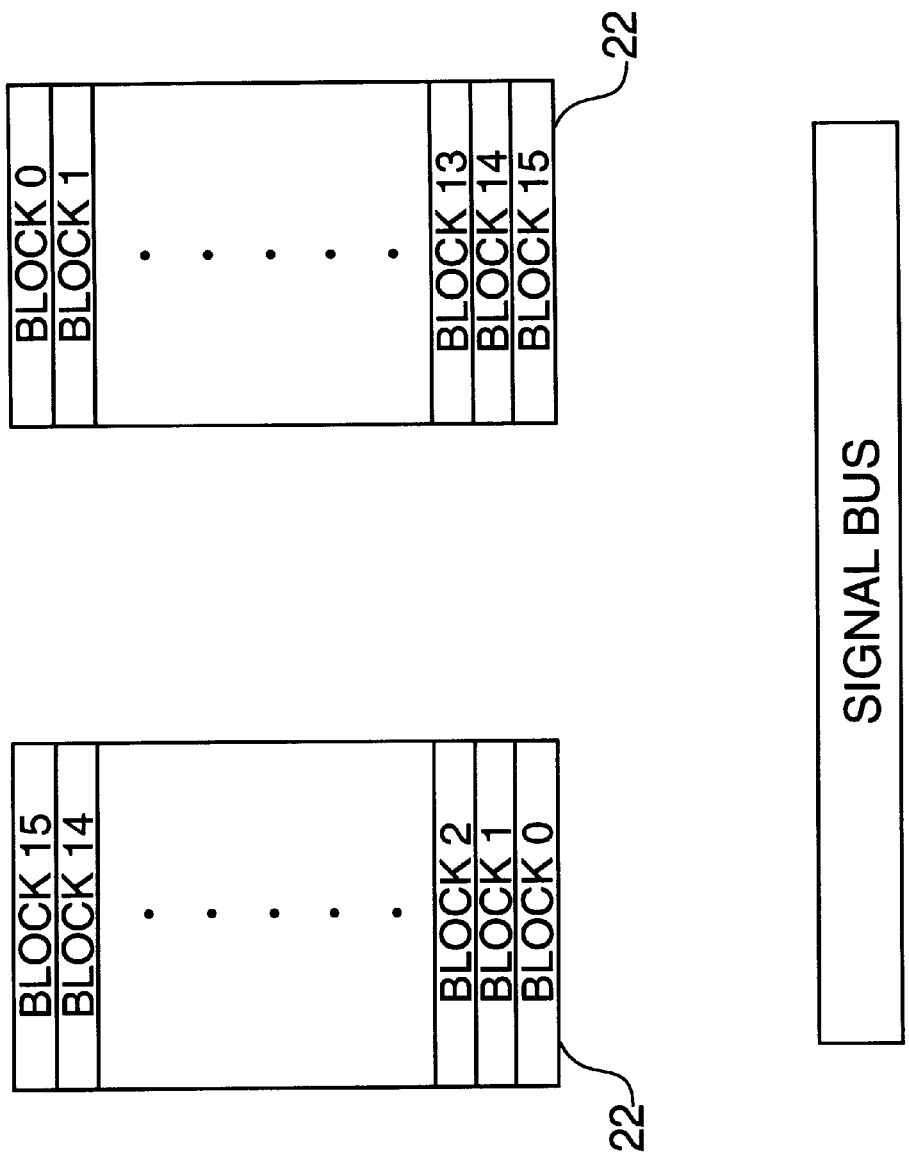
FIG. 7 is a block diagram showing the structure and operation of a first embodiment of the block address assignment aspect of present invention.

In this aspect of the invention, addresses are assigned to blocks in left and right units of each bank such that the same numbered blocks of the left and right units are not located adjacent to each other. In a first embodiment of this aspect of the invention, as shown in FIG. 7, the blocks can be arranged such that the bottommost block in the left unit is addressed as block 0 while the bottommost block in the right unit is addressed as block 15. Then, the next block up from the bottom in the left unit is addressed as block 1, while the next block up from the bottom in the right unit is addressed as block 14.

By assigning addresses to blocks in this manner, the uneven current dissipation, heating, and changing signal voltage drop effects described above are greatly reduced or eliminated. This is so because when accessing block 0 in both units, the path of the current bearing signals to block 0 in the left unit is relatively short, while the path of the current bearing signals to block 0 in the right unit is relatively long, with the result that the current dissipated by the path of the signals to blocks 0 in both units averages out. In this manner, the current consumed while accessing sequentially numbered locations alternately from the left and the right units, as is commonly performed in column burst mode operation, will remain at a nearly constant average level, regardless of the block address from which the data is accessed. Moreover, the uneven heating and voltage drop effects are reduced because signal currents extend to physically different locations in the left and the right units and the signal voltage drop is subject to an averaging effect from the end 22 of the double unit into the selected blocks.

Figure 8:
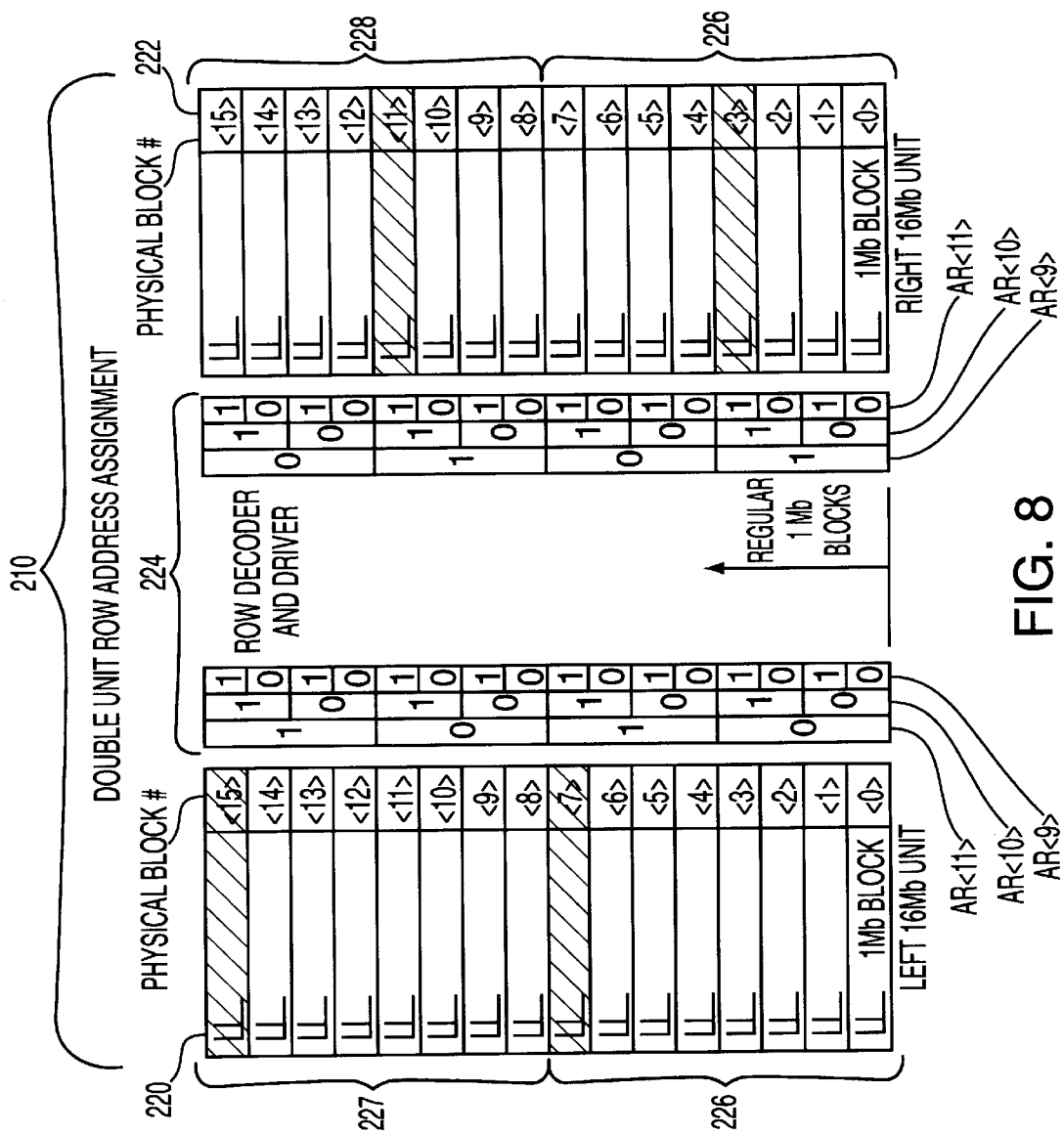
FIG. 8 is a block diagram showing the structure and operation of a second embodiment of the block address assignment aspect of present invention.

A second embodiment of this aspect of the invention is described with reference to FIG. 8. As shown therein, a double memory unit 210 of 32 Mb capacity is arranged with a left 16 Mb unit 220 including 1 Mb physical blocks 0 to 15 (numbers correlating with physical locations), and a right 16 Mb unit 222 including 1 Mb physical blocks 0 to 15. Lower row domains 226 include blocks 0 to 7, while upper row domains 228 include blocks 8 to 15.

Between the left and right units, 220, 222 is a row decoder and driver unit 224, which is arranged to activate wordlines in particular blocks of each unit 220, 222, in accordance with three row address bits AR11, AR10, AR9, with AR11 being the most significant bit.

In the case of the left 16 Mb unit 220, row decoders are arranged such that the blocks selected by row address bits AR11, AR10, AR9 correspond directly to the physical block numbers. For example, in the left unit 220, for row address values on AR11, AR10, AR9 of (1,1,1), block 7 is activated.

In the case of the right 16 Mb unit 222, row decoders are arranged differently such that blocks selected by the row address bits AR11, AR10, AR9 lie at different locations than the physical block numbers which correspond to the combination of row address bits. For example, in FIG. 8, row address input on AR11, AR10, AR9 of (1,1,1) selects block 3 in the right unit 223 rather than block 7 as in the left unit 220.

Blocks in the upper row domains 228 are selected such that the physical block number selected for access equals the physical block number of the selected block in the lower domain 226 plus 8. For example, in the left unit 220, the selected blocks are block 7 and block 15, while in the right unit 22, the selected blocks are block 3 and block 11.

In addition, the combination of this important aspect of the invention with the shared row decoder (FIG. 5) of the invention helps to ensure that adjacent blocks within a unit or bank are not activated simultaneously. In consequence, signals propagate at more uniform speed to and from locations within the left and right units of a unit or bank.

INTRA-UNIT COLUMN ADDRESS INCREMENT PIPELINING

Figure 9:
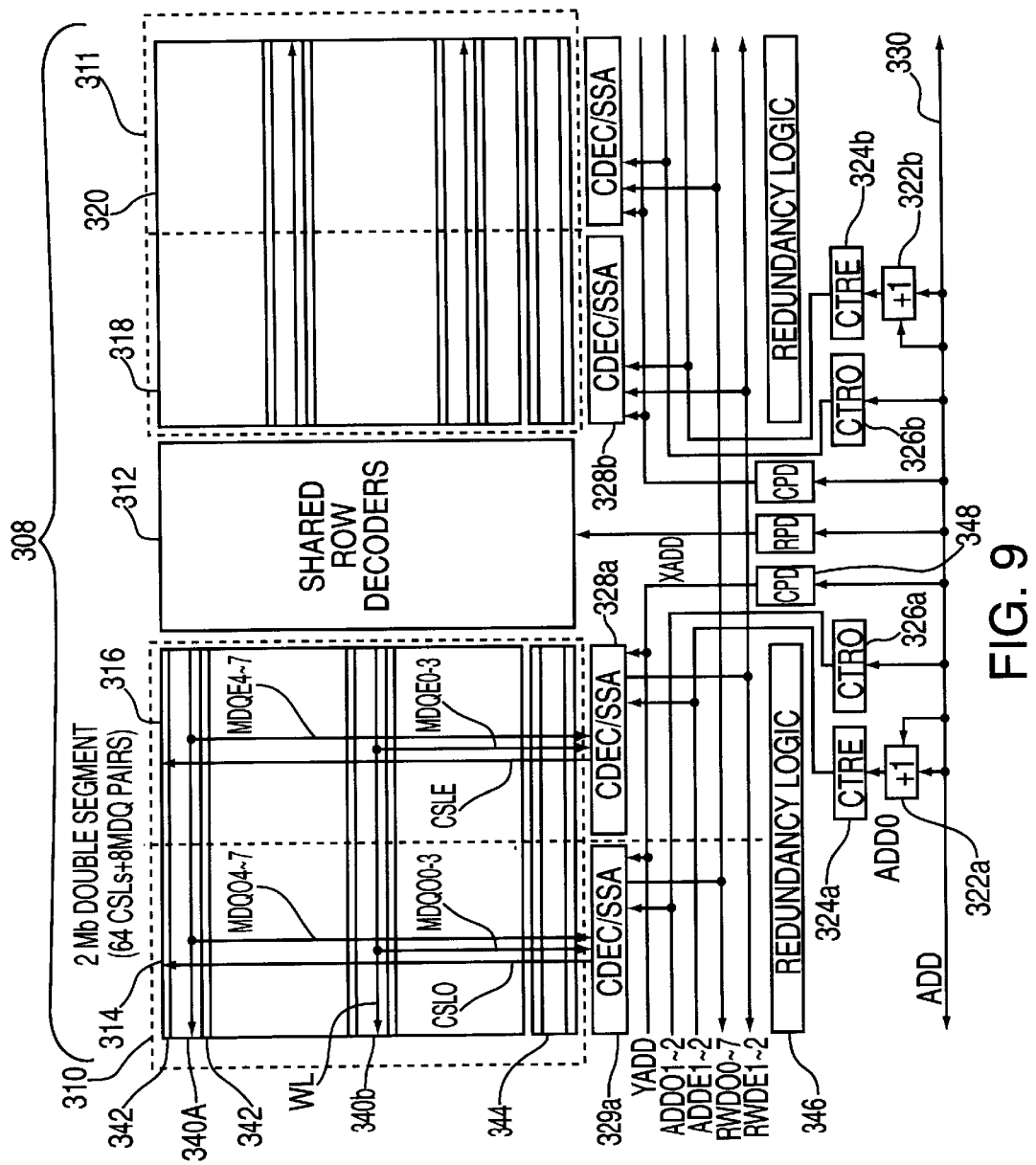
FIG. 9 is a block and schematic diagram showing the structure and operation of the column address increment pipelining aspect of present invention.

FIG. 9 is a block and schematic diagram showing the design for a 32 Mb double unit 308 of a 256 Mb DRAM. The goal of this design is to permit a single unit to operate as a bank, while implementing column address increment pipelining to boost memory access speed. The double unit 308 includes a pair left and right units 310, 311 of 16 Mb capacity. Left and right units 310, 311 are configured to operate as separate banks which share a row decoder unit 312 having shared row decoders therein such as those described above with reference to FIG. 5.

Each unit 310, 311 is divided into odd and even column domains; left unit 310 includes odd and even column domains 314 and 316; and right unit 311 includes even and odd column domains 318 and 320. Each column domain 314, 316 of a bank 310 is further divided into four 2 Mb double segments, each of which includes an upper 1 Mb segment and a lower 1 Mb segment. For example, within a double segment of the even domain 316, 1 of 64 column select lines (CSLs) is used to access four master DQ line pairs (MDQE 4–7) from the upper segment and four master DQ line pairs (MDQE 0–3) from the lower segment.

Units 310, 311 are divided row-wise into sixteen 1 Mb array blocks, (only two blocks 340a, 340b, shown for the purpose of simplicity), each block containing a storage array block having 512 rows, i.e. 512 wordlines (WLs). Sense amplifier (SA) units 342 are placed in pairs with each storage array block, one SA unit 342 above each storage array block 340a and one SA unit 342 below. Each SA unit 342 contains 1024 sense amplifiers which are active on alternate bitline pairs in interleaved fashion with respect to the other SA unit 342 of the pair to support the 2048 total bitline pairs of the storage array block 340a. In addition to the sixteen 1 Mb unit blocks 340a, 340b, etc., a redundancy array block of 160 Kb capacity which has 80 redundancy wordlines (RWLs) is provided within each unit 310, and 311. Redundancy logic 346 controls access to regions of redundancy array block 344.

Associated with each unit 310, 311 are column address circuitry as follows. Associated with the even column domain 316 is a plus-one adder 322a which receives the lowest order column address bits YADD0–2, and increments the bits by one. An even column domain counter (CTRE) 324a receives the incremented YADD0–2 and cyclically updates the value. Associated with the odd column domain 314 is an odd column domain counter (CTRO) 326a which receives the column address bits YADD0–2 directly from address bus 330 and cyclically updates that value. Column predecoder (CPD) 348 predecodes other column address bits. Coupled to the outputs of CPD 348, CTRE 324a and CTRO 326a are column decoder/second sense amplifier (CDEC/SSA) units 329a, 328a, respectively, which perform the final decoding operations to activate selected column select lines CSLO and CSLE in the odd and even column domains 314, 316, respectively.

Column address increment pipelining performed by the invention within a unit will now be described. Within the left unit 310, for example, odd unit counter CTRO 326a receives the three lowest order address signals YADD0–2 from address bus 330 and transfers them to the CDEC/SSA 329a for the odd column domain 314. No incrementing of address signals provided to odd column domain 314 is required.

For the even column domain 316, a plus-one adder 322a receives the lowest order column address bits YADD0–2, increments the bits by one and outputs the result to an even unit counter (CTRE) 324a, which then passes the incremented address to CDEC/SSA 328a for the even column domain 316. Column predecoder (CPD) 348 decodes address bits YADD3–7, and provides predecoded signals for these higher order bits to both the odd and the even column domains 314, 316.

Simultaneous storage access to sixteen bits is provided as follows. A single wordline in each of two 1 Mb blocks 340a, 340b is activated in accordance with predecoded row addresses provided to shared row decoder 312. The lowest order column addresses YADD0–2 are incremented by plus-one adder 322a and output provided to CTRE 324a. The lowest order column addresses YADD0–2 are provided directly to CTRO without being incremented. In consequence, column select lines CSLO and CSLE are activated in odd and even column domains 314, 316, respectively, in accordance with the predecoded addresses provided by CPD 348 and the outputs of counters CTRO and CTRE.

Figure 4:
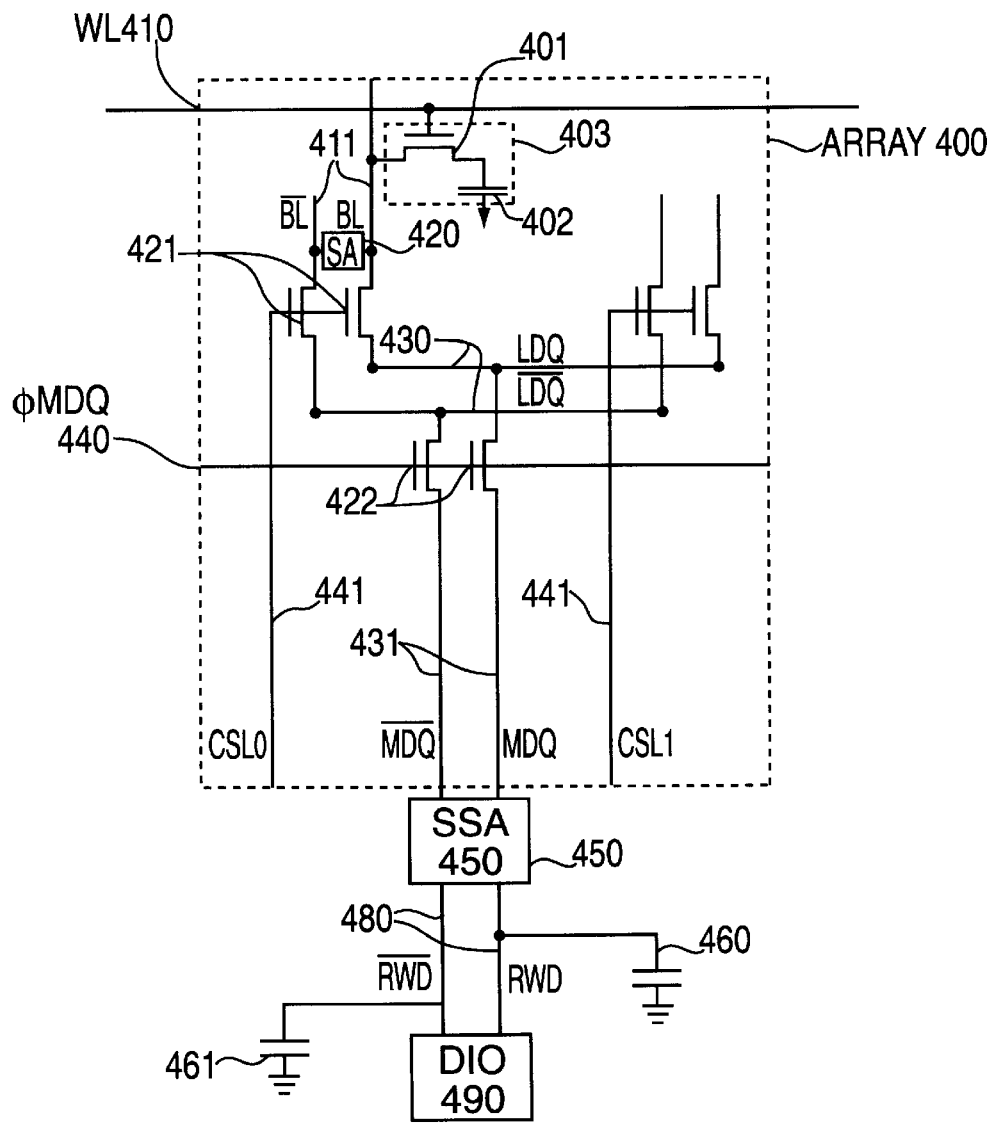
FIG. 4 is a block and schematic diagram showing the structure and operation of access circuitry within a prior art dynamic RAM.
Figure 4B:
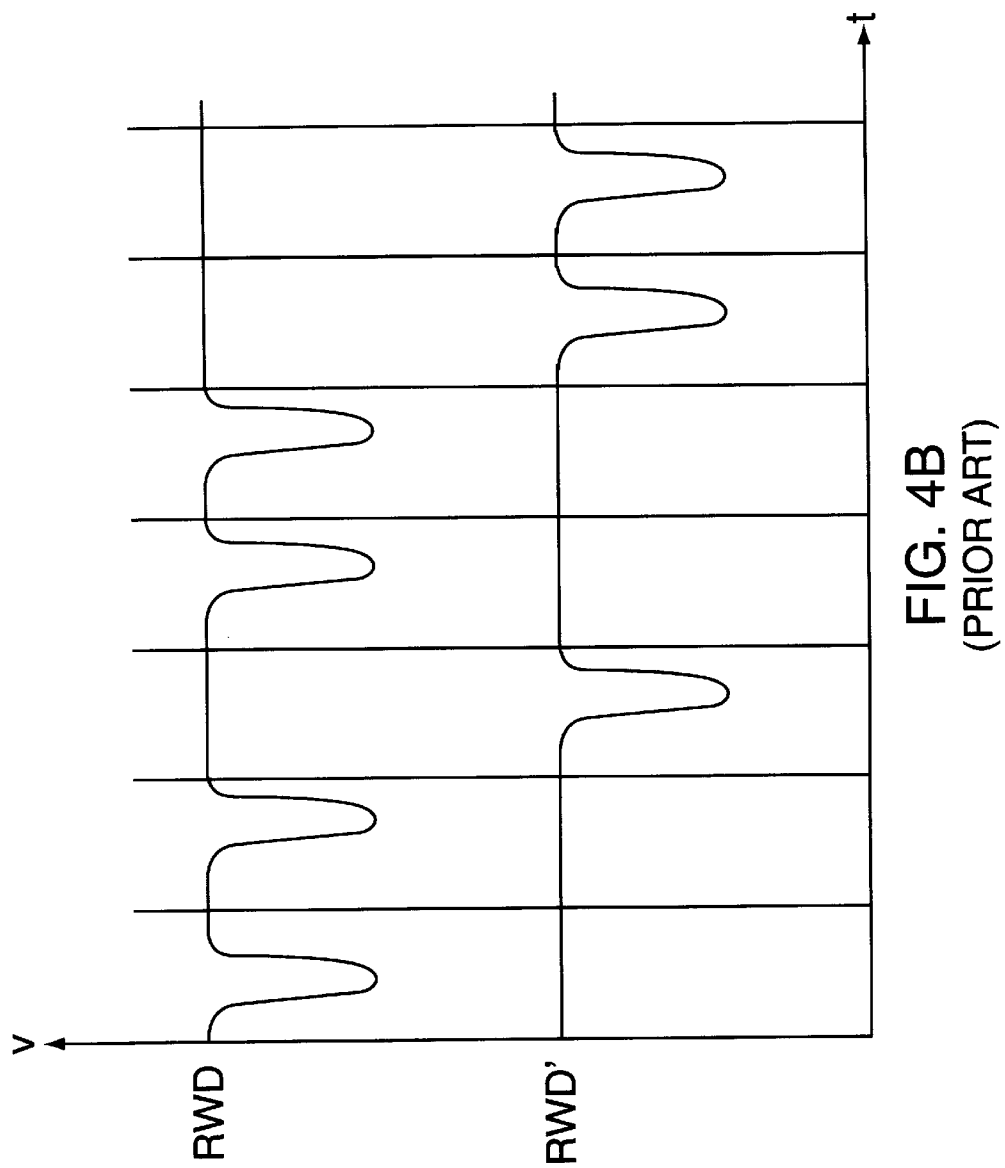
FIG. 4b is a timing diagram illustrating the signal swing of signals RWD, RWD' of a read write drive.

In a read operation, with the activation of CSLO and CSLE four data bits are transferred from storage cells coupled to the activated wordline in block 340a onto four bitline pairs in the upper 1 Mb segment of the odd column domain 314, which data bits are then transferred onto master bitline pairs MDQO 4–7. Likewise, four data bits are transferred from storage cells coupled to the activated wordline in block 340a onto four bitline pairs in the upper 1 Mb segment of the even column domain 316, which data bits are then transferred onto master bitline pairs MDQE 4–7. In addition, four data bits are transferred from storage cells coupled to the activated wordline in block 340b onto four bitline pairs of the lower 1 Mb segment in the odd column domain 314, which data bits are then transferred onto master bitline pairs MDQO 0–3. Likewise, four data bits are transferred from storage cells coupled to the activated wordline in block 340b onto four bitline pairs of the lower 1 Mb segment in the even column domain 316, which data bits are then transferred onto master bitline pairs MDQE 0–3. The data bits on lines MDQE 0–7 are sensed and transmitted on even domain read write drive bus RWDE 0–7 to DIO 490 (FIG. 4a) and the data bits on lines MDQO 0–7 are sensed and transmitted on odd domain read write drive bus RWDO 0–7 to DIO 490 (FIG. 4a).

Thus, the circuitry and method of the present invention has been shown to provide column address increment pipelining within a single unit 310.

III. SINGLE ENDED READ WRITE DRIVE CONVERSION

Figure 10:
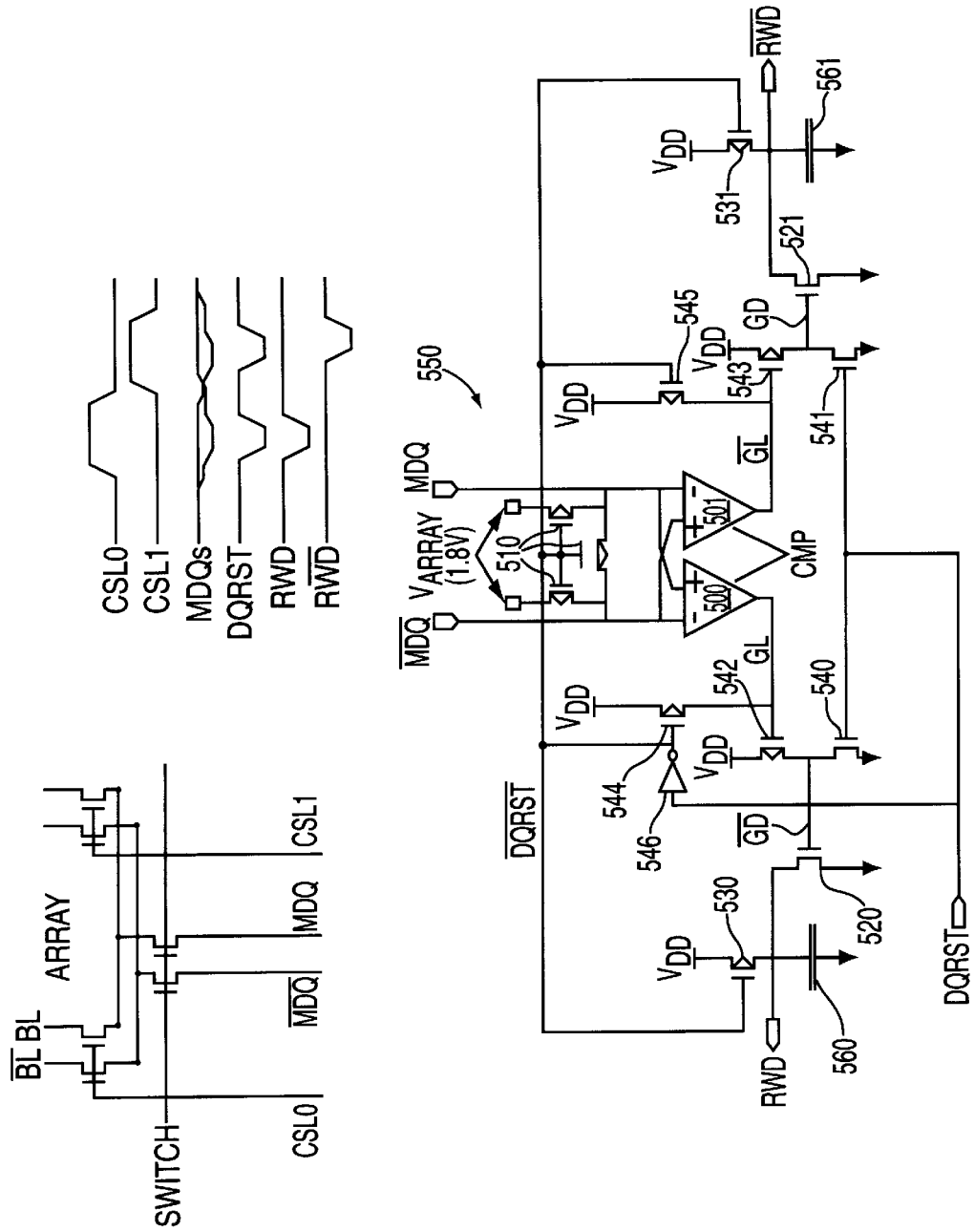
FIG. 10 is a block and schematic diagram showing the structure and operation of a read write drive signal generator which includes two second sense amplifiers.

FIG. 10 contains a block and schematic diagram showing the design for a second sense amplifier unit (SSA) 550. The second sense amplifier unit (SSA) 650 described below is a further improvement over SSA 550. However, the SSA unit 550 is not admitted by the Applicants to be prior art. The SSA 550 includes two current mirror sense amplifiers (CMPs) 500 and 501 and a precharge/equalization circuit 510 (shown exemplarily as including three PFETS, coupled to a constant voltage source $V_{ARRAY}$, and to a time-varying precharge signal DQRST'). In addition, SSA 550 includes RWD switches 520 and 521 (shown exemplarily as NFETs), RWD precharge devices 530 and 531 (shown exemplarily as PFETs), and support devices 540–546.

When all column select lines CSLs are LOW (at a low voltage level), the signal DQRST is HIGH (at a high voltage level) and the signal DQRST', the inverted signal thereof from inverter 546, is LOW, which causes PFETs 544 and 545 to be ON (in the on state). In consequence, signal lines GL and GL' which are tied to source terminals of PFETs 544 and 545 are maintained HIGH. Nodes GD and GD' are then both LOW, since NFETs 540, 541 are ON, PFETs 542 and 543 are OFF, and NFETs 520 and 521 are OFF. Then the read write drive signal pair RWD and RWD' are precharged to a voltage level $V_{DD}$ by PFETs 530 and 531.

When a CSL is raised HIGH, a corresponding pair of bitlines BL and BL' are switched into electrical contact with an MDQ line pair, as described above. During this interval, DQRST is held high which precharges the MDQ line pair. When DQRST falls, the CMP pair 500, 501 becomes enabled and develops sensing results corresponding to the signal values on the MDQ line pair. At that time signals GL and GL' follow the sensing results developed by CMPs 500 and 501, which signals are then followed by signals GD and GD'.

Here, the operation of SSA 550 can be best explained with an example. When the value of the data being sensed from a bitline is '0', as represented by a lower voltage level present on signal line MDQ than line MDQ', by operation of CMPs 501 and 500, GL falls LOW while GL' remains HIGH. The LOW going signal GL causes PFET 542 to turn on, forcing signal output RWD to LOW. Signal RWD', by contrast, remains HIGH,. since NFET 521 remains in OFF condition. When signal DQRST rises HIGH again, signals GL and GL', GD and GD', RWD and RWD' are precharged to HIGH, LOW, and HIGH levels again, respectively.

This system, however, has the following disadvantages:

1. RWD and RWD' both drive large capacitive loads 560, 561, respectively. The capacitance is generally of the order of 5 pF. For DRAMs which have a ×32 organization, as that term is used in the Watanabe Article referenced herein, a typical operational voltage swing of 2.5 V, and bit access speed of 200 MHz, the steady state current required to drive these loads is 80 mA.

2. The necessity of a precharge interval for restoring levels on signals RWD or RWD' between data intervals makes it more difficult to implement faster machine cycles in synchronous DRAMs, and increases the design complexity of DIO circuitry.

Figure 11:
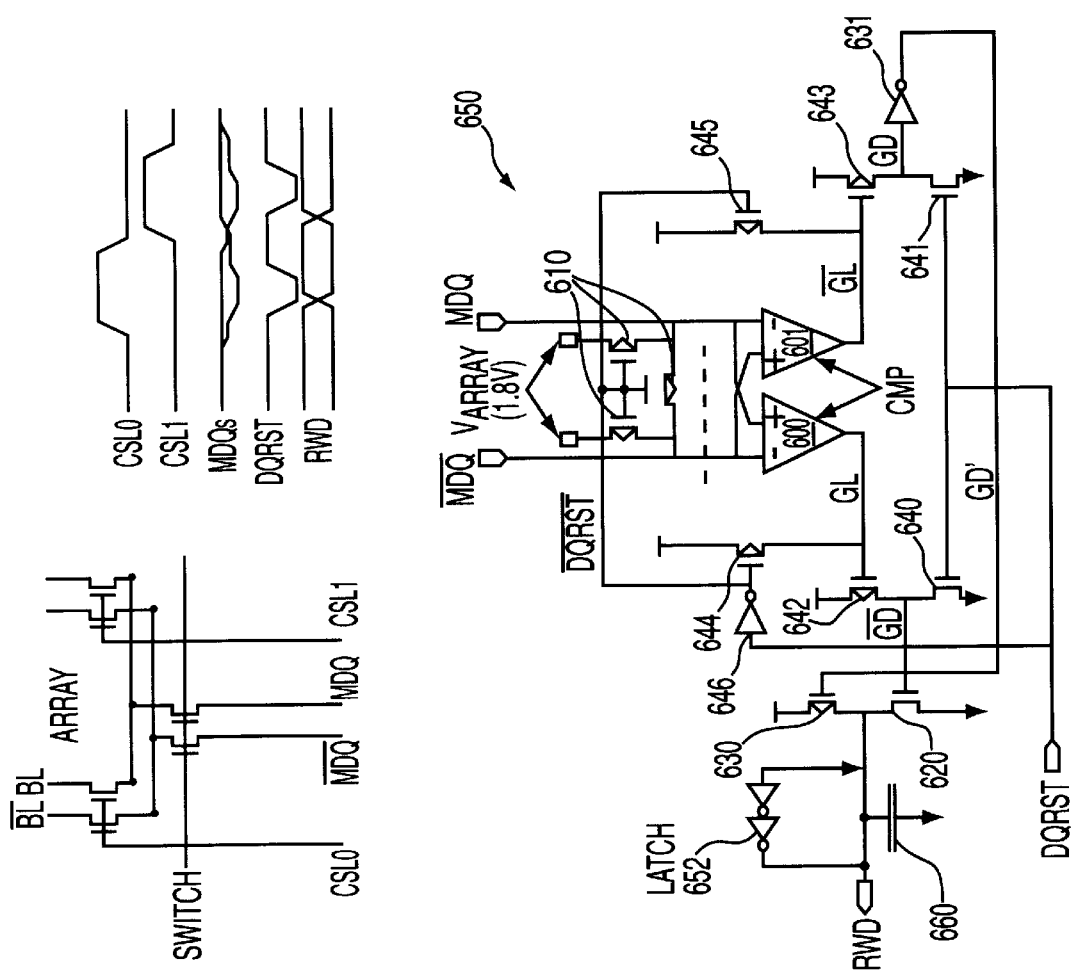
FIG. 11 is a block and schematic diagram showing the structure and operation of the single ended read write drive of the present invention.

A further improved SSA circuit 650 is shown schematically in FIG. 11. Like the SSA circuit 550 shown in FIG. 10, SSA circuit 650 includes two CMPs 600, 601, a precharge/equalization circuit including three PFETs 610, and support devices 640 through 646, which are essentially the same as or identical to those shown in SSA circuit 550. However, SSA 650 replaces the NFETs 520, 521 used to drive the RWD, RWD' signals in SSA 550 (FIG. 10) with a unitary CMOS driver including NFET 620 and PFET 630 to provided singleended RWD operation. PFETs 530, 531, used to precharge signals RWD, RWD' in SSA 550, have been eliminated from SSA 650.

The operation of SSA 650 will now be described, with reference to FIG. 11. When the CSL is not enabled, DQRST remains at a HIGH level which precharges the MDQ pair and maintains CMPs 600, 601 in disabled condition. When the CSL is activated, DQRST falls, ending the precharge operation and CMPs 600, 601 become enabled simultaneously. As a result, signals GL and GL' follow the sensing results of CMPs 600 and 601, which results are then followed again by signals GD, GD' and GD'.

Here, the operation of SSA 650 can best be explained with an example. When the value of the data being sensed on a bitline is '0', as represented by a lower voltage level present on signal line MDQ than line MDQ', by operation of CMPs 600 and 601, GL falls LOW while GL' remains HIGH. The low-going GL signal turns on PFET 642, which in turn, causes signal GD' to go HIGH, while signals GD and GD' are maintained LOW and HIGH, respectively. In consequence, NFET 620 turns on, driving output RWD to LOW level and latching the data thereon with devices 652. Signal DQRST rises HIGH again soon; however, the data is latched onto RWD and cannot change until DQRST falls again. The switching of DQRST to the HIGH level again causes signals GL, GL', and GD, GD' and GD' to be precharged again to HIGH, and LOW levels, respectively.

It will be understood that the advantages of SSA circuit 650 of the present invention over SSA circuit 550 (FIG. 10) include the following:

1. The single-ended RWD signal drives a large capacitive load 660 of typically 5 pF, but the voltage level thereon swings only when the data in a given cycle changes from its state in the last previous cycle. In SSA circuit 550, at least one of signals RWD or RWD' had to be precharged in every cycle. Then, the voltage level had to swing on at least one of signals RWD or RWD' to indicate the data bit for that cycle, i.e. a '0' would appear in the current cycle on signal RWD', while a '1' would appear on signal RWD. Since the SSA circuit 650 eliminates the precharge interval entirely, at least one half of all voltage swings on the RWD line are eliminated.

Further, assuming that randomized data are stored and read out from the memory, the probability that the data changes in a given cycle is one half. With SSA circuit 550 (FIG. 10), a voltage swing on at least one of RWD and RWD' signals was required to indicate the presence of either a '0' or '1' in the data stream. SSA circuit 650 (FIG. 11) of the present invention, which transmits both '0' and '1' data on the same single-ended RWD line, does not require the voltage to swing from one cycle to the next if the next bit in the data stream is the same as the last. Therefore, the number of voltage swings for the RWD signal are reduced again by half in relation to the operation of the SSA circuit 550. Considered together, the operation of SSA circuit 650, under the same conditions as those described for SSA circuit 550, results in a reduction of current by 75% from 80 mA to 20 mA. Even assuming worse conditions in which the transferred data bits change levels once in every cycle, the amount of required current increases only by a factor of 2 to 40 mA.

2. The elimination of a precharge interval on the signal RWD permits faster machine cycles to be implemented in synchronous DRAMs, without increasing the design complexity of the DIO circuitry. With the SSA circuit 650, as shown in FIG. 11, data can be transferred from the RWD to the DIO at DIO input clock frequencies of at least 400 Mhz.

3. In addition, it will be understood that the invention reduces the number of RWD signal lines within the DRAM by one half. While the invention has been described in accordance with certain preferred embodiments thereof, those skilled in the art will recognize the many modifications and enhancements that can be made without departing from the true scope and spirit of the appended claims.

What is claimed is:

1. A shared row decoder for providing separate demultiplexed timed row selection signals to each of a first memory unit and a second memory unit, comprising:

an address input circuit responsive to the states of a plurality of time multiplexed row address signals for generating a single, one bit decoded row address result at each particular time;

a first selection circuit coupled to receive said one bit result, a first block selection input, and a first demultiplexing timing signal at a first time to provide a first timed selection signal at said first time to said first memory unit; and a second selection circuit coupled to receive said one bit result, a second block selection input, and a second demultiplexing timing signal at a second time to provide a second timed selection signal at said second time to said second memory unit.

2. The shared row decoder of claim 1 wherein said first and said second timing signals are pulsed signals.

3. The shared row decoder of claim 2 wherein said first selection circuit further comprises a latch responsive to said enabled conditions of said first block selection input, said first timing signal and said one bit decoded row address result to maintain said first timed selection signal in enabled condition after said first timing signal becomes disabled.

4. The shared row decoder of claim 3 wherein said second selection circuit further comprises a latch responsive to said enabled conditions of said second block selection input, said second timing signal and said one bit decoded row address result to maintain said second timed selection signal in enabled condition after said second timing signal becomes disabled.

5. The shared row decoder of claim 2 wherein said first and said second timing signals are pulsed at different times corresponding to respective times at which said first and said second block selection inputs are enabled.

6. A method of providing separate demultiplexed timed selection signals to each of a first memory unit and a second memory unit, comprising the steps of:

obtaining a single one bit decoded row address result at each particular time from a plurality of time multiplexed row address signals presented to a decoder;

setting a first row selecting latch at a first time for a first memory unit in response to said one bit decoded result, a first demultiplexing timing signal and a first block selection input; and setting a second row selecting latch at a second time for a second memory unit in response to said one bit decoded result, a second demultiplexing timing signal and a second block selection input.

7. The method of claim 6 wherein said first and second timing signals are pulsed to enter said enabled conditions.

8. The method of claim 7 wherein said first and said second timing signals are pulsed at different times corresponding to respective times at which said first And said second block selection inputs are in said enabled conditions.

* * * * *